United States Patent
Jung et al.

(10) Patent No.: US 9,949,395 B2
(45) Date of Patent: Apr. 17, 2018

(54) ELECTRONIC DEVICE ADOPTING KEY-WATERPROOF STRUCTURE AND METHOD FOR WATERPROOFING KEY THEREOF

(71) Applicant: Samsung Electronics Co., Ltd., Suwon-si, Gyeonggi-do (KR)

(72) Inventors: Youngjun Jung, Daegu (KR); Taewon Kim, Daegu (KR); Eonseog Cheon, Daegu (KR); Junghee Hwang, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 14/876,294

(22) Filed: Oct. 6, 2015

(65) Prior Publication Data
US 2016/0100499 A1 Apr. 7, 2016

(30) Foreign Application Priority Data

Oct. 6, 2014 (KR) .................. 10-2014-0134423

(51) Int. Cl.
| | |
|---|---|
| *H05K 5/06* | (2006.01) |
| *G06F 1/16* | (2006.01) |
| *H04M 1/18* | (2006.01) |
| *H01H 13/06* | (2006.01) |
| *H04M 1/23* | (2006.01) |

(52) U.S. Cl.
CPC .......... *H05K 5/062* (2013.01); *G06F 1/1656* (2013.01); *G06F 1/1662* (2013.01); *G06F 1/1671* (2013.01); *H04M 1/18* (2013.01); *H01H 13/06* (2013.01); *H01H 2231/022* (2013.01); *H04M 1/23* (2013.01)

(58) Field of Classification Search
CPC ...... G06F 1/1656; H05K 5/062; H05K 1/189; H01H 13/063; H01H 13/86
USPC ...... 361/679.3, 679.55, 749; 200/302, 302.2, 200/513
See application file for complete search history.

(56) References Cited

U.S. PATENT DOCUMENTS

| | | | |
|---|---|---|---|
| 8,625,290 B2 | 1/2014 | Wee et al. | |
| 2004/0004823 A1* | 1/2004 | Sakata | H01L 23/4985 361/795 |
| 2010/0053077 A1* | 3/2010 | Huang | G06F 1/1616 345/156 |
| 2012/0273244 A1* | 11/2012 | Takita | H05K 5/069 174/50 |

(Continued)

FOREIGN PATENT DOCUMENTS

| | | |
|---|---|---|
| JP | 2009-188488 A | 8/2009 |
| KR | 10-2011-0041390 A | 4/2011 |

*Primary Examiner* — Mukund G Patel
(74) *Attorney, Agent, or Firm* — Jefferson IP Law, LLP

(57) ABSTRACT

An electronic device and a method of waterproofing a key thereof are provided. The electronic device includes a body, a display device disposed in the body, a key disposed in the body, and a key-waterproof structure including an insert-injected product that includes an insert-injected sealing area, and a bonding area where a silicon-not-attached portion is formed. The method includes assembling a flexible printed circuit board, to which a key is attached, through a silicon-not-attached portion of an insert-injected product, which is made by insert-injecting a bracket and silicon rubber, and bonding the silicon-not-attached portion.

14 Claims, 13 Drawing Sheets

(56) References Cited

U.S. PATENT DOCUMENTS

2014/0252882 A1   9/2014   Dinh et al.

* cited by examiner

ELECTRONIC DEVICE ADOPTING KEY-WATERPROOF STRUCTURE AND METHOD FOR WATERPROOFING KEY THEREOF

CROSS-REFERENCE TO RELATED APPLICATION(S)

This application claims the benefit under 35 U.S.C. § 119(a) of a Korean patent application filed on Oct. 6, 2014 in the Korean Intellectual Property Office and assigned Serial number 10-2014-0134423, the entire disclosure of which is hereby incorporated by reference.

TECHNICAL FIELD

The present disclosure relates to an electronic device adopting a key-waterproof structure and a method for waterproofing a key thereof.

BACKGROUND

Mobile phones of the related art are limited to a voice call function, and personal computers are provided at home or offices in order to be used by a few users.

However, recently introduced smart phones and tablet personal computers (PCs) are not limited to specific uses in the same way as related-art mobile phones and personal computers, and are manufactured to be small so that users carry the device as a necessity anytime and anywhere.

With the development of mobile technology and the advancement of computing devices, portable devices, such as the smart phones and the table PCs, adopt a high-capacity data storage medium, a high-performance calculating and processing unit, and a high-speed communication module therein in order to thereby perform the operation that was previously possible only by the related-art PCs.

The portable device, such as the smart phone and the tablet PC, adopts a home-key that implement various functions in a one-touch type to enhance the user's convenience.

The home-key, which implements various functions using one touch, should be provided with a waterproof structure. To this end, in the related art, the components of the home-key are assembled in a stack to be bonded to a bracket portion of a circuit board using dedicated equipment or a jig, and silicon rubber is placed on the same to then be pressed and assembled.

However, according to the prior art, it is not easy to implement the waterproof structure because of the complicated assembly process, and it causes a wide bonding area and a bonding failure in a bonding and silicon assembly process, so it is difficult to find and manage water-seepage due to the bonding failure.

In addition, since the whole area should be bonded using an adhesive, the equipment and the jig may be excessively used, and thus it is hard to manage the use of the jig as well.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device adopting a key-waterproof structure and a method for waterproofing a key, a circuit board bracket and silicon rubber are sealed through the insert injection process while the area where a flexible circuit board passes remains unbonded, and the flexible circuit board is assembled through the flexible circuit board passing area, i.e., the unbonded area, to then perform a bonding operation with respect to the unbonded area. Therefore, the waterproofing process can be simplified, and the waterproof performance can be enhanced while waterproof points and the processing cost can be reduced.

In accordance with an aspect of the present disclosure, an electronic device is provided. The device includes a body, a display device disposed in the body, a key disposed in the body, and a key-waterproof structure including an insert-injected product that includes an insert-injected sealing area, and a bonding area where a silicon-not-attached portion is formed.

In accordance with another aspect of the present disclosure, a method is provided. The method includes assembling a flexible printed circuit board, to which a key is attached, through a silicon-not-attached portion of an insert-injected product, which is made by insert-injecting a bracket and silicon rubber, and bonding the silicon-not-attached portion.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 4A and 4B illustrate portable terminals as examples of an electronic device adopting a key-waterproof structure, according to various embodiments of the present disclosure, wherein FIG. 4A shows a mobile phone and FIG. 4B shows a tablet personal computer (PC) according to various embodiments of the present disclosure;

Throughout the drawings, it should be noted that like reference numbers are used to depict the same or similar elements, features, and structures.

DETAILED DESCRIPTION

Figure 1:
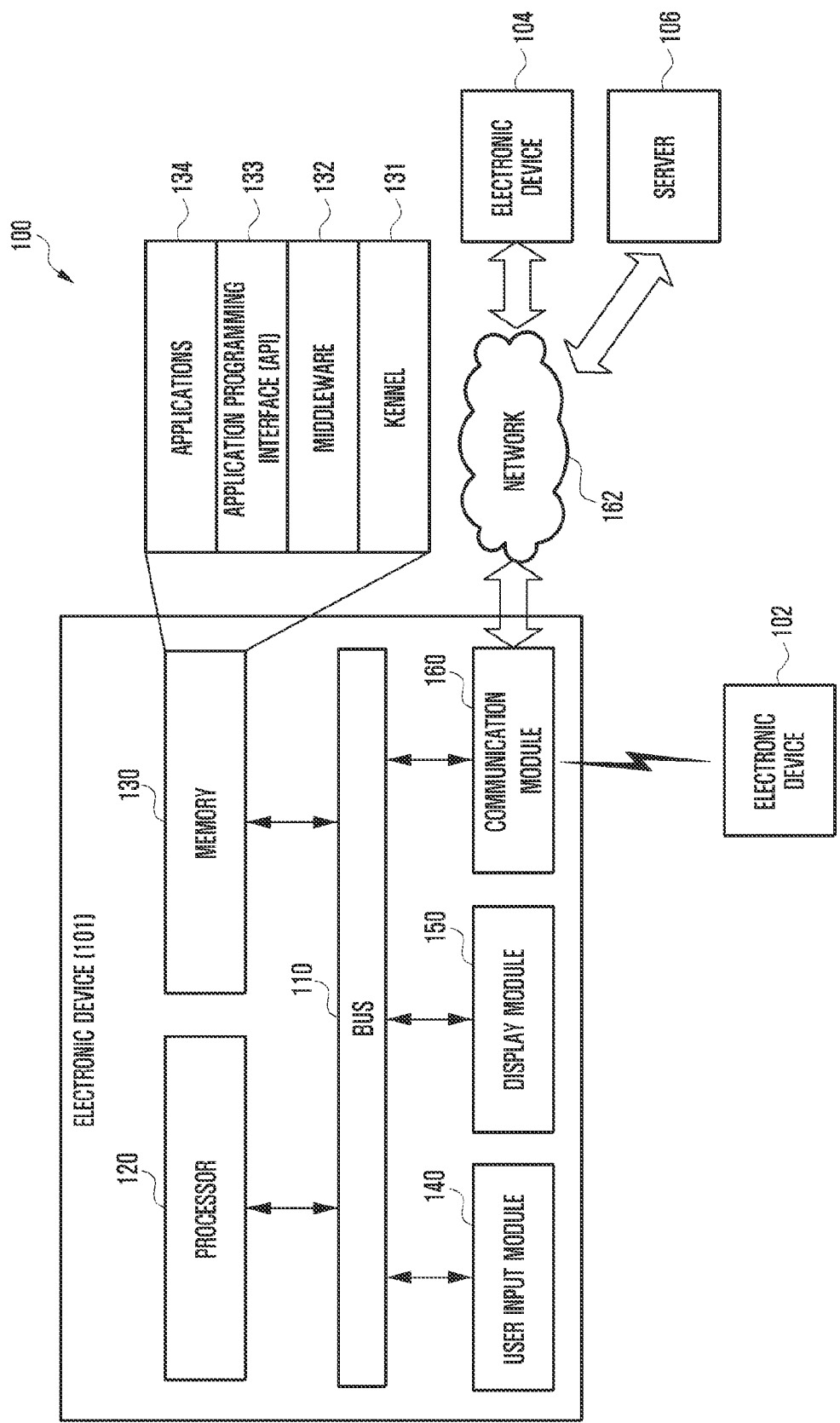
FIG. 1 illustrates a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a digital video disc (DVD) player, an audio device, various medical devices (for example, magnetic resonance angiography (MRA), magnetic resonance imaging (MRI), computed tomography (CT), a scanning machine, a ultrasonic wave device, or the like), a navigation device, a global positioning system (GPS) receiver, an event data recorder (EDR), a flight data recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

FIG. 1 is a block diagram illustrating a configuration of a network environment according to an embodiment of the present disclosure.

Referring to FIG. 1, the network environment 100 includes electronic device 101, electronic device 102, electronic device 104, server 106, and network 162. The electronic device 101 may include a bus 110, a processor 120, a memory 130, a user input module 140, a display module 150, a communication module 160, and other similar and/or suitable components.

The bus 110 may be a circuit which interconnects the above-described elements and delivers a communication (e.g., a control message) between the above-described elements.

The processor 120 may receive commands from the above-described other elements (e.g., the memory 130, the user input module 140, the display module 150, the communication module 160, etc.) through the bus 110, may interpret the received commands, and may execute calculation or data processing according to the interpreted commands.

The memory 130 may store commands or data received from the processor 120 or other elements (e.g., the user input module 140, the display module 150, the communication module 160, etc.) or generated by the processor 120 or the other elements. The memory 130 may include programming modules, such as a kernel 131, middleware 132, an application programming interface (API) 133, an application 134, and the like. Each of the above-described programming modules may be implemented in software, firmware, hardware, or a combination of two or more thereof.

The kernel 131 may control or manage system resources (e.g., the bus 110, the processor 120, the memory 130, etc.) used to execute operations or functions implemented by other programming modules (e.g., the middleware 132, the API 133, and the application 134). Also, the kernel 131 may provide an interface capable of accessing and controlling or managing the individual elements of the electronic device 101 by using the middleware 132, the API 133, or the application 134.

The middleware 132 may serve to go between the API 133 or the application 134 and the kernel 131 in such a manner that the API 133 or the application 134 communicates with the kernel 131 and exchanges data therewith. Also, in relation to work requests received from one or more applications 134 and/or the middleware 132, for example, may perform load balancing of the work requests by using a method of assigning a priority, in which system resources (e.g., the bus 110, the processor 120, the memory 130, etc.) of the electronic device 101 can be used, to at least one of the one or more applications 134.

The API 133 is an interface through which the application 134 is capable of controlling a function provided by the kernel 131 or the middleware 132, and may include, for example, at least one interface or function for file control, window control, image processing, character control, or the like.

The user input module 140, for example, may receive a command or data as input from a user, and may deliver the received command or data to the processor 120 or the memory 130 through the bus 110. The display module 150 may display a video, an image, data, or the like to the user.

The communication module 160 may connect communication between another electronic device 102 and the electronic device 101. The communication module 160 may support a predetermined short-range communication protocol (e.g., Wi-Fi, bluetooth (BT), and near field communication (NFC)), or predetermined network communication (e.g., the Internet, a local area network (LAN), a wide area network (WAN), a telecommunication network, a cellular network, a satellite network, a plain old telephone service (POTS), or the like). Each of the electronic devices 102 and 104 may be a device which is identical (e.g., of an identical type) to or different (e.g., of a different type) from the electronic device 101. Further, the communication module 160 may connect communication between a server 164 and the electronic device 101 via the network 162.

Figure 2:
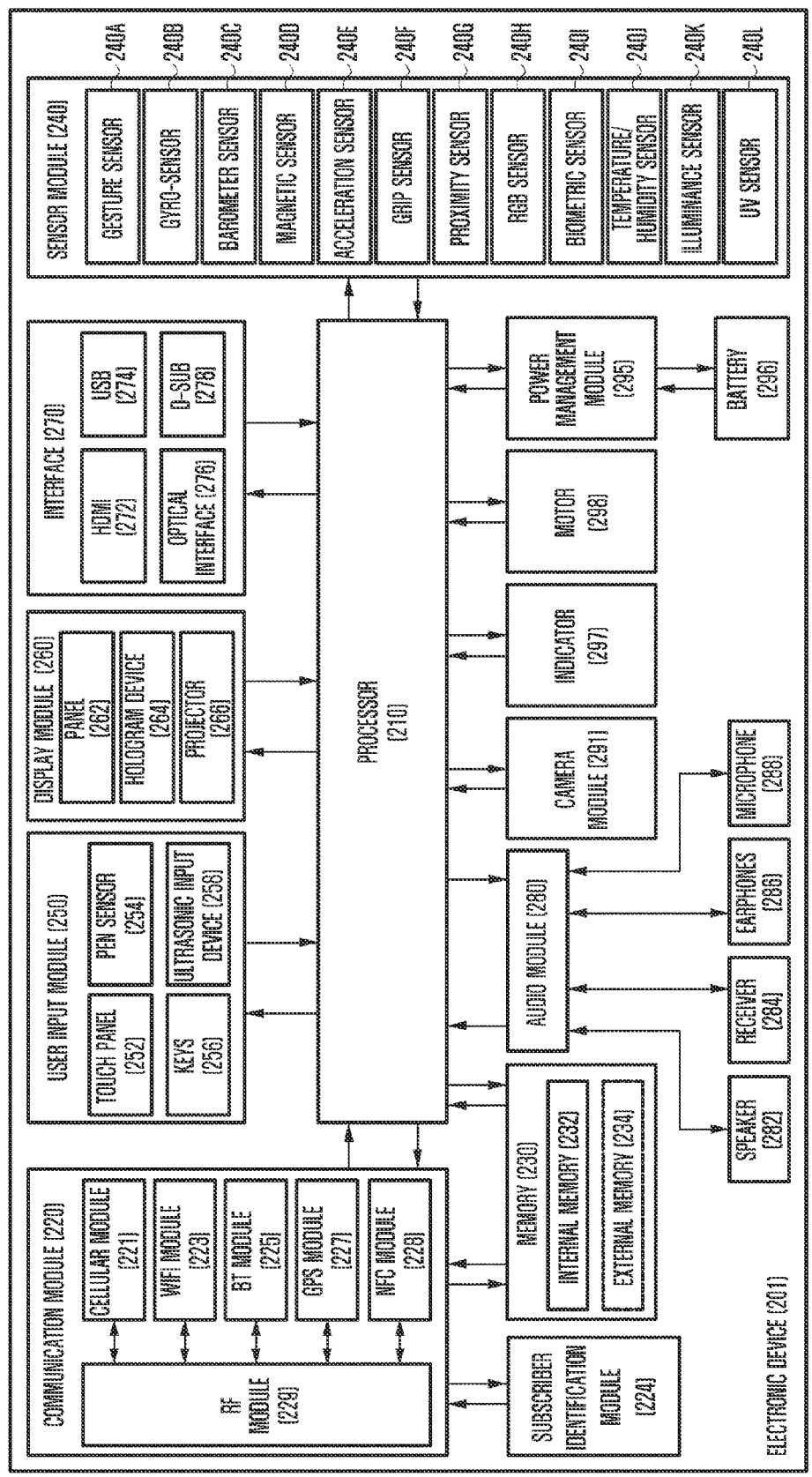
FIG. 2 is a block diagram of an electronic device according to various embodiments of the present disclosure.

FIG. 2 is a block diagram illustrating a configuration of hardware 201 according to an embodiment of the present disclosure.

The hardware 201 may be, for example, the electronic device 101 illustrated in FIG. 1.

Referring to FIG. 2, the hardware 201 may include one or more processors 210, a subscriber identification module (SIM) card 224, a communication module 220, a memory 230, a sensor module 240, a user input module 250, a display module 260, an interface 270, an audio coder/decoder (codec) 280, a camera module 291, a power management module 295, a battery 296, an indicator 297, a motor 298 and any other similar and/or suitable components.

The processor 210 (e.g., the processor 120) may include one or more application processors (APs), or one or more communication processors (CPs). The processor 210 may be, for example, the processor 120 illustrated in FIG. 1. The AP and the CP are illustrated as being included in the processor 210 in FIG. 2, but may be included in different integrated circuit (IC) packages, respectively. According to an embodiment of the present disclosure, the AP and the CP may be included in one IC package.

The AP may execute an operating system (OS) or an application program, and thereby may control multiple hardware or software elements connected to the AP and may perform processing of and arithmetic operations on various data including multimedia data. The AP may be implemented by, for example, a system on chip (SoC). According to an embodiment of the present disclosure, the processor 210 may further include a graphical processing unit (GPU) (not illustrated).

The CP may manage a data line and may convert a communication protocol in the case of communication between the electronic device (e.g., the electronic device 101) including the hardware 201 and different electronic devices connected to the electronic device through the network. The CP may be implemented by, for example, a SoC. According to an embodiment of the present disclosure, the CP may perform at least some of multimedia control functions. The CP, for example, may distinguish and authenticate a terminal in a communication network by using a SIM 224. Also, the CP may provide the user with services, such as a voice telephony call, a video telephony call, a text message, packet data, and the like.

Further, the CP may control the transmission and reception of data by the communication module 220. In FIG. 2, the elements such as the CP, the power management module 295, the memory 230, and the like are illustrated as elements separate from the AP. However, according to an embodiment of the present disclosure, the AP may include at least some (e.g., the CP) of the above-described elements.

According to an embodiment of the present disclosure, the AP or the CP may load, to a volatile memory, a command or data received from at least one of a non-volatile memory and other elements connected to each of the AP and the CP, and may process the loaded command or data. Also, the AP or the CP may store, in a non-volatile memory, data received from or generated by at least one of the other elements.

The SIM 224 may be inserted into a slot formed in a particular portion of the electronic device 101. The SIM 224 may include unique identification information (e.g., integrated circuit card identifier (ICCID)) or subscriber information (e.g., international mobile subscriber identity (IMSI)).

The memory 230 may include an internal memory 232 and an external memory 234. The memory 230 may be, for example, the memory 130 illustrated in FIG. 1. The internal memory 232 may include, for example, at least one of a volatile memory (e.g., a dynamic random access memory (DRAM), a static RAM (SRAM), a synchronous dynamic RAM (SDRAM), etc.), and a non-volatile memory (e.g., a one time programmable ready only memory (OTPROM), a programmable ROM (PROM), an erasable and programmable ROM (EPROM), an electrically erasable and programmable ROM (EEPROM), a mask ROM, a flash ROM, a not AND (NAND) flash memory, a not OR (NOR) flash memory, etc.). According to an embodiment of the present disclosure, the internal memory 232 may be in the form of a solid state drive (SSD). The external memory 234 may further include a flash drive, for example, a compact flash (CF), a secure digital (SD), a micro-SD, a mini-SD, an extreme Digital (xD), a memory stick, or the like.

The communication module 220 may be, for example, the communication module 160 illustrated in FIG. 1. The communication module 220 may include at least one of, for example, a cellular module 221, a Wi-Fi module 223, a BT module 225, a GPS module 227, a NFC module 228, or radio frequency (RF) module 229. For example, the communication module 220 may provide a wireless communication function by using a radio frequency. Additionally or alternatively, the communication module 220 may include a network interface (e.g., a LAN card), a modulator/demodulator (modem), or the like for connecting the hardware 201 to a network (e.g., the Internet, a LAN, a WAN, a telecommunication network, a cellular network, a satellite network, a POTS, or the like).

The RF module 229 may be used for transmission and reception of data, for example, transmission and reception of RF signals or electronic signals. Although not illustrated, the RF module 229 may include, for example, a transceiver, a power amplifier module (PAM), a frequency filter, a low noise amplifier (LNA), or the like. Also, the RF module 229 may further include a component for transmitting and receiving electromagnetic waves in a free space in a wireless communication, for example, a conductor, a conductive wire, or the like.

The sensor module 240 may include, for example, at least one of a gesture sensor 240A, a gyro sensor 240B, a barometer sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illuminance sensor 240K, and a ultra violet (UV) sensor 240L. The sensor module 240 may measure a physical quantity or may sense an operating state of the electronic device 101, and may convert the measured or sensed information to an electrical signal. Additionally/alternatively, the sensor module 240 may include, for example, an E-nose sensor (not illustrated), an electromyography (EMG) sensor (not illustrated), an electroencephalogram (EEG) sensor (not illustrated), an electrocardiogram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein.

The user input module 250 may include a touch panel 252, a pen sensor 254 (e.g., a digital pen sensor), keys 256, and an ultrasonic input unit 258. The user input module 250 may be, for example, the user input module 140 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware 201 may receive a user input from an external device (e.g., a network, a computer, or a server), which is connected to the communication module 220, through the communication module 220.

The display module 260 may include at least one of a panel 262, a hologram device 264, or a projector 266. The display module 260 may be, for example, the display module 150 illustrated in FIG. 1. The panel 262 may be, for example, a liquid crystal display (LCD) and an active matrix organic light emitting diode (AM-OLED) display, and the like. The panel 262 may be implemented so as to be, for example, flexible, transparent, or wearable. The panel 262 may include the touch panel 252 and one module. The hologram device 264 may display a three-dimensional image in the air by using interference of light. According to an embodiment of the present disclosure, the display module 260 may further include a control circuit for controlling the panel 262, the hologram device 264, or the projector 266.

The interface 270 may include, for example, a high-definition multimedia interface (HDMI) 272, a universal serial bus (USB) 274, an optical interface 276, and a d-subminiature (D-sub) 278. Additionally or alternatively, the interface 270 may include, for example, SD/multi-media card (MMC) (not illustrated) or infrared data association (IrDA) (not illustrated).

The audio codec 280 may bidirectionally convert between a voice and an electrical signal. The audio codec 280 may convert voice information, which is input to or output from the audio codec 280, through, for example, a speaker 282, a receiver 284, an earphone 286, the microphone 288 or the like.

The camera module 291 may capture an image and a moving image. According to an embodiment, the camera module 291 may include one or more image sensors (e.g., a front lens or a back lens), an image signal processor (ISP) (not illustrated), and a flash LED (not illustrated).

The power management module 295 may manage power of the hardware 201. Although not illustrated, the power management module 295 may include, for example, a power management integrated circuit (PMIC), a charger integrated circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 201 or a part (e.g., the processor 210) of the hardware 201, for example, a booting state, a message state, a charging state and the like. The motor 298 may convert an electrical signal into a mechanical vibration. The processor 210 may control the sensor module 240.

Although not illustrated, the hardware 201 may include a processing unit (e.g., a GPU) for supporting a module TV. The processing unit for supporting a module TV may process media data according to standards such as, for example, digital multimedia broadcasting (DMB), digital video broadcasting (DVB), media flow, and the like. Each of the above-described elements of the hardware 201 according to an embodiment of the present disclosure may include one or more components, and the name of the relevant element may change depending on the type of electronic device. The hardware 201 according to an embodiment of the present disclosure may include at least one of the above-described elements. Some of the above-described elements may be omitted from the hardware 201, or the hardware 201 may further include additional elements. Also, some of the elements of the hardware 201 according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" according to an embodiment of the present disclosure may include at least one of an application-specific integrated circuit (ASIC) chip, a field-programmable gate array (FPGA), and a programmable-logic device for performing certain operations which have been known or are to be developed in the future.

Figure 3:
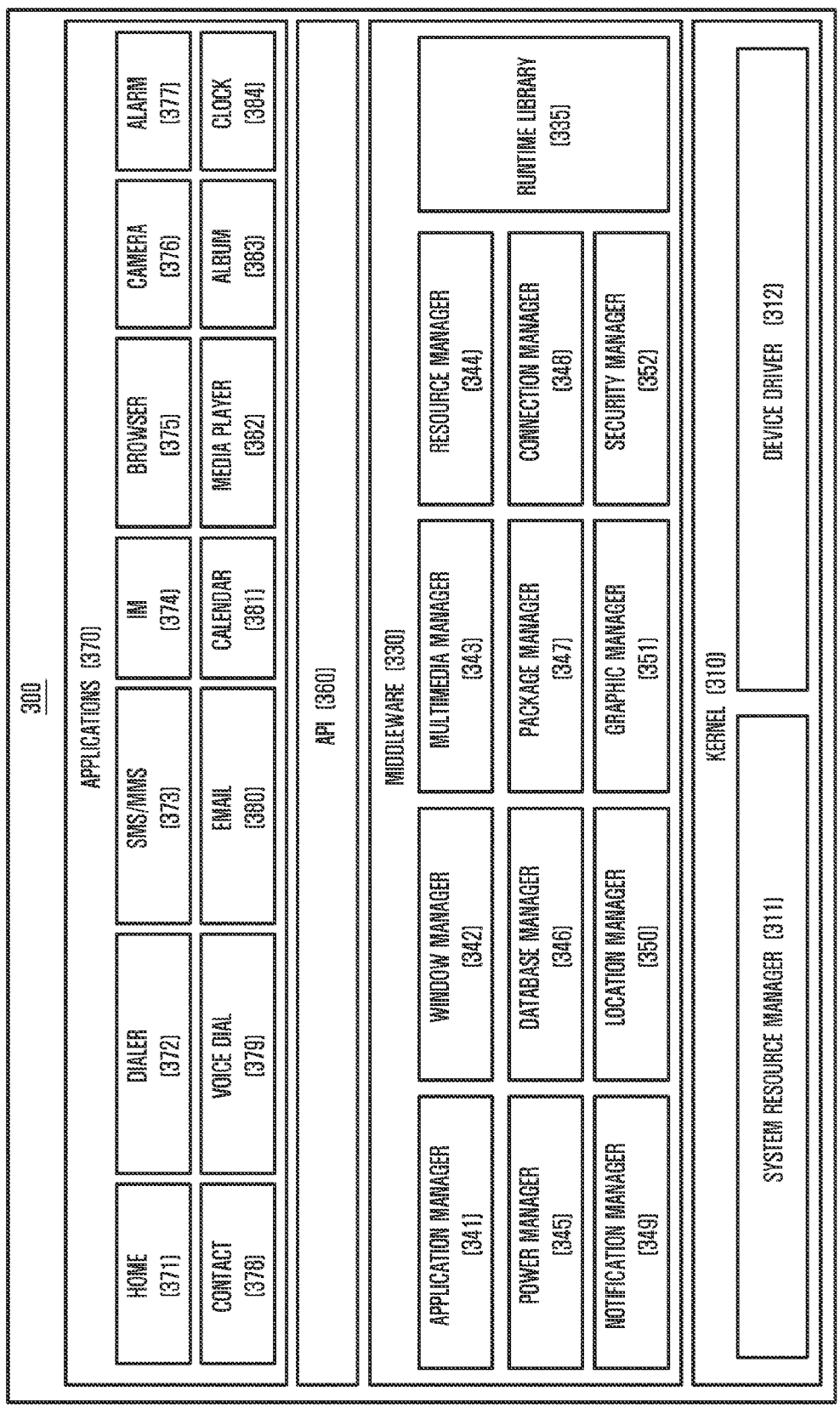
FIG. 3 is a block diagram of a program module according to various embodiments of the present disclosure.

FIG. 3 is a block diagram illustrating a configuration of a programming module 300 according to an embodiment of the present disclosure.

The programming module 300 may be included (or stored) in the electronic device 101 (e.g., the memory 130) or may be included (or stored) in the electronic device 201 (e.g., the memory 230) illustrated in FIG. 1. At least a part of the programming module 300 may be implemented in software, firmware, hardware, or a combination of two or more thereof. The programming module 300 may be implemented in hardware (e.g., the hardware 201), and may include an OS controlling resources related to an electronic device (e.g., the electronic device 101) and/or various applications (e.g., an application 370) executed in the OS. For example, the OS may be Android, iOS, Windows, Symbian, Tizen, Bada, and the like.

Referring to FIG. 3, the programming module 300 may include a kernel 310, a middleware 330, an API 360, and/or the application 370.

The kernel 310 (e.g., the kernel 131) may include a system resource manager 311 and/or a device driver 312. The system resource manager 311 may include, for example, a process manager (not illustrated), a memory manager (not illustrated), and a file system manager (not illustrated). The system resource manager 311 may perform the control, allocation, recovery, and/or the like of system resources. The device driver 312 may include, for example, a display driver (not illustrated), a camera driver (not illustrated), a Bluetooth driver (not illustrated), a shared memory driver (not illustrated), a USB driver (not illustrated), a keypad driver (not illustrated), a Wi-Fi driver (not illustrated), and/or an audio driver (not illustrated). Also, according to an embodiment of the present disclosure, the device driver 312 may include an inter-process communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 132) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a basic input/output system (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 101) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 133) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 134) may include, for example, a preloaded application and/or a third party application. The applications 370 (e.g., the applications 134) may include, for example, a home application 371, a dialer application 372, a short message service (SMS)/multimedia message service (MMS) application 373, an instant message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the one or more processors 210), the one or more processors may perform functions corresponding to the instructions. The non-transitory computer-readable storage medium may be, for example, the memory 230. At least a part of the programming module 300 may be implemented (e.g., executed) by, for example, the one or more processors 210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. Also, some of the operations may be omitted, or other operations may be added to the operations.

Figure 4A:
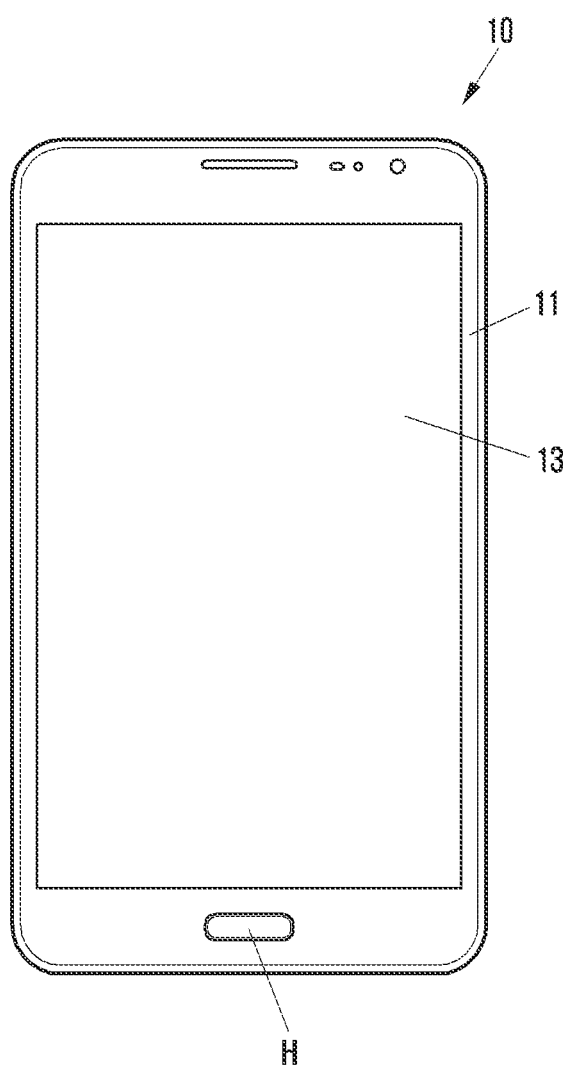
Figure 4B:
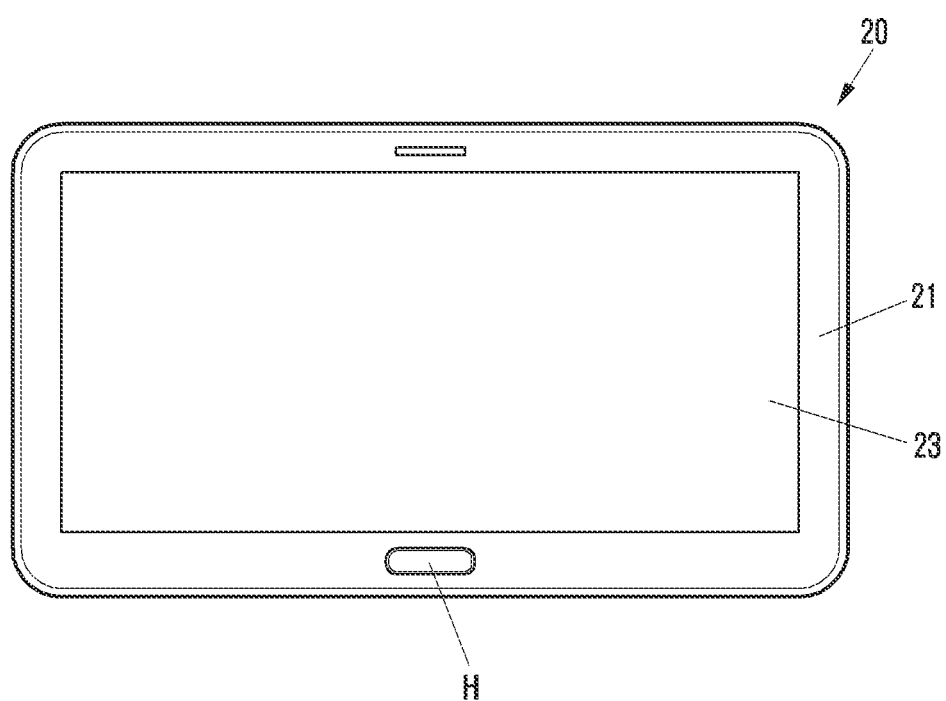

FIGS. 4A and 4B are front views illustrating a portable terminal as an example of an electronic device adopting a key-waterproof structure, according to various embodiments of the present disclosure.

Meanwhile, FIGS. 4A and 4B illustrate portable terminals, with FIG. 4A schematically shows a mobile phone and FIG. 4B schematically shows a tablet PC.

As shown in FIG. 4A, a mobile phone 10 includes a wide display device 13 provided in the center of the front surface of a body 11, and the display device 13 is implemented in a touch driving type rather than a complicated keypad type.

In addition, a home-key H is provided at the lower portion of the front surface of the mobile phone 10. The home-key H implements various functions of the mobile phone 10 in a one-touch type in order to thereby enhance the user's convenience.

In addition, as shown in FIG. 4B, the tablet PC 20 includes a display device 23, which is touch-operable, provided in the center of the front surface of a body 21, and a home-key H is provided at the lower portion of the front surface of the body 21, similar to the mobile phone mentioned above.

As described above, the home-key H of the mobile phone and the tablet PC implements a predetermined operation through the portable device. For example, when the home-key H is pressed or touched while the portable device is in use, convenient functions may be provided; for example, the display image may return to a background image.

Figure 5:
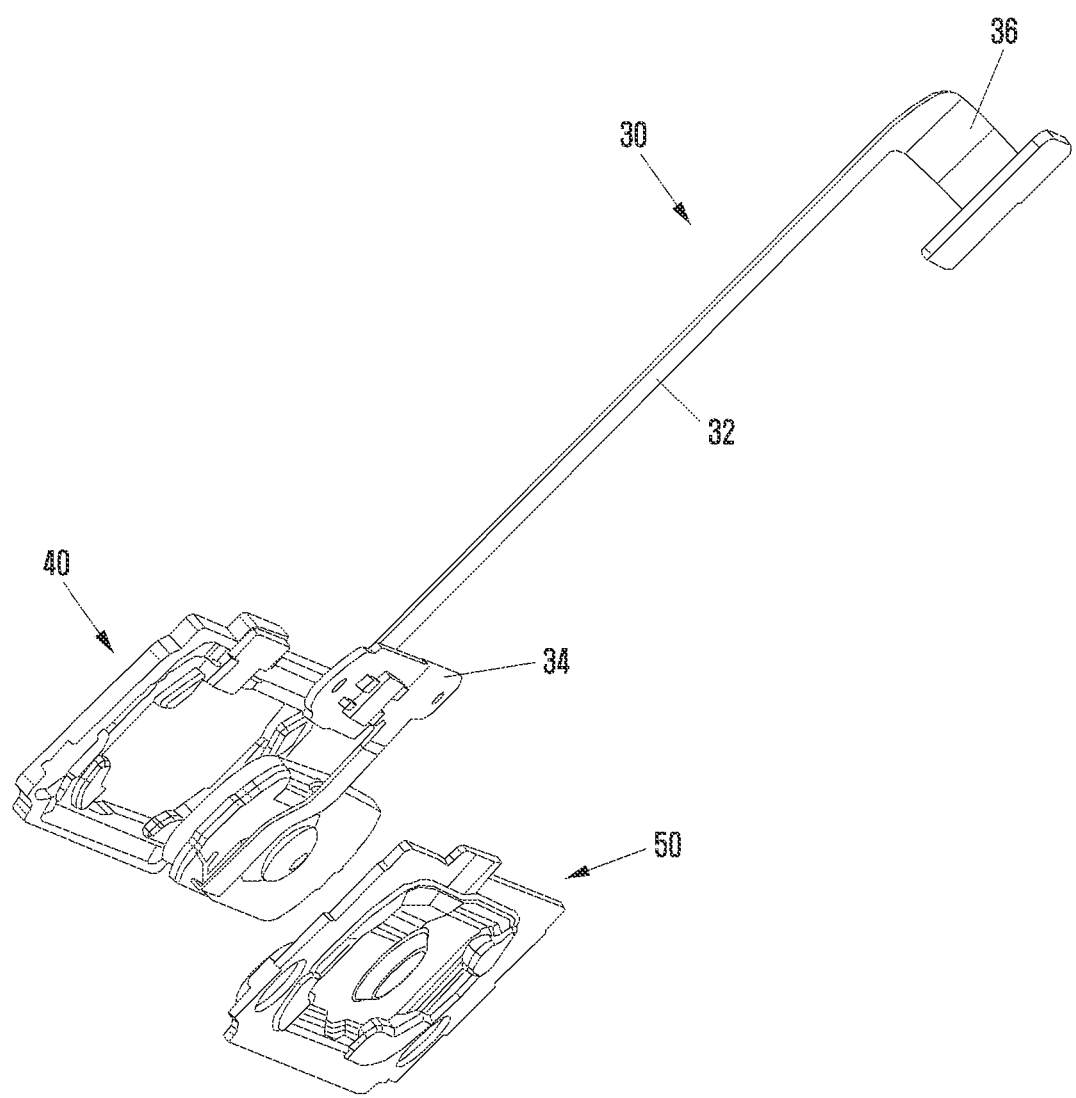
FIG. 5 is an exploded perspective view illustrating a key-waterproof structure of the portable terminal of FIGS. 4A and 4B according to various embodiments of the present disclosure.

FIG. 5 is an exploded perspective view illustrating a key-waterproof structure of the portable terminal of FIGS. 4A and 4B according to various embodiments of the present disclosure.

Figure 6:
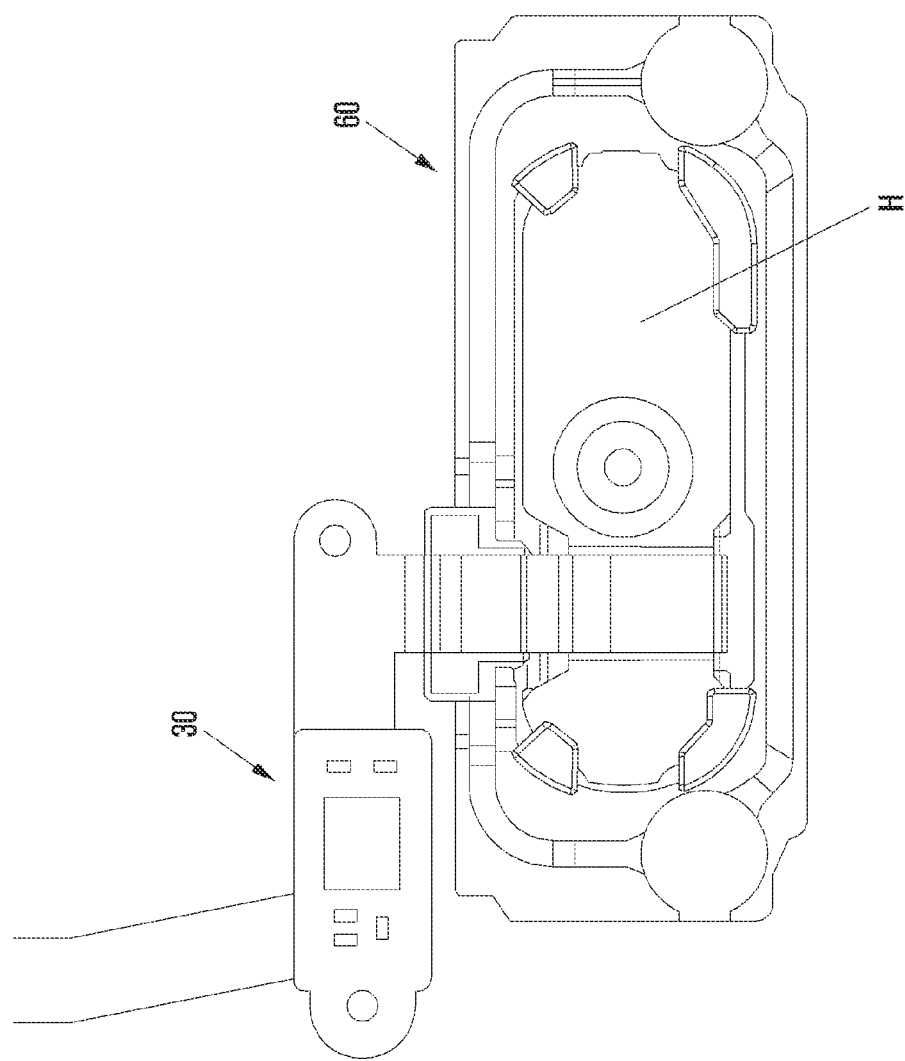
FIG. 6 is a combined plan view of the key-waterproof structure of FIG. 5 according to various embodiments of the present disclosure.

FIG. 6 is a combined plan view of the key-waterproof structure of FIG. 5 according to various embodiments of the present disclosure.

Figure 7:
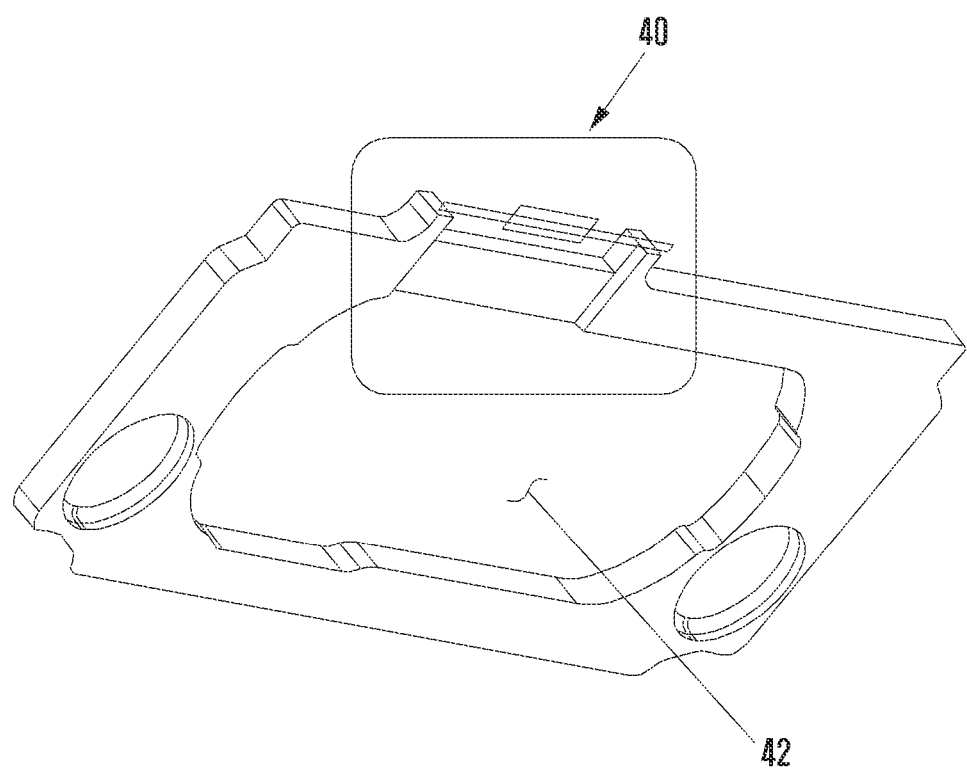
FIG. 7 is a perspective view illustrating a bracket of the key-waterproof structure of FIG. 5 according to various embodiments of the present disclosure.

FIG. 7 is a perspective view illustrating a bracket of the key-waterproof structure of FIG. 5 according to various embodiments of the present disclosure.

Figure 8:
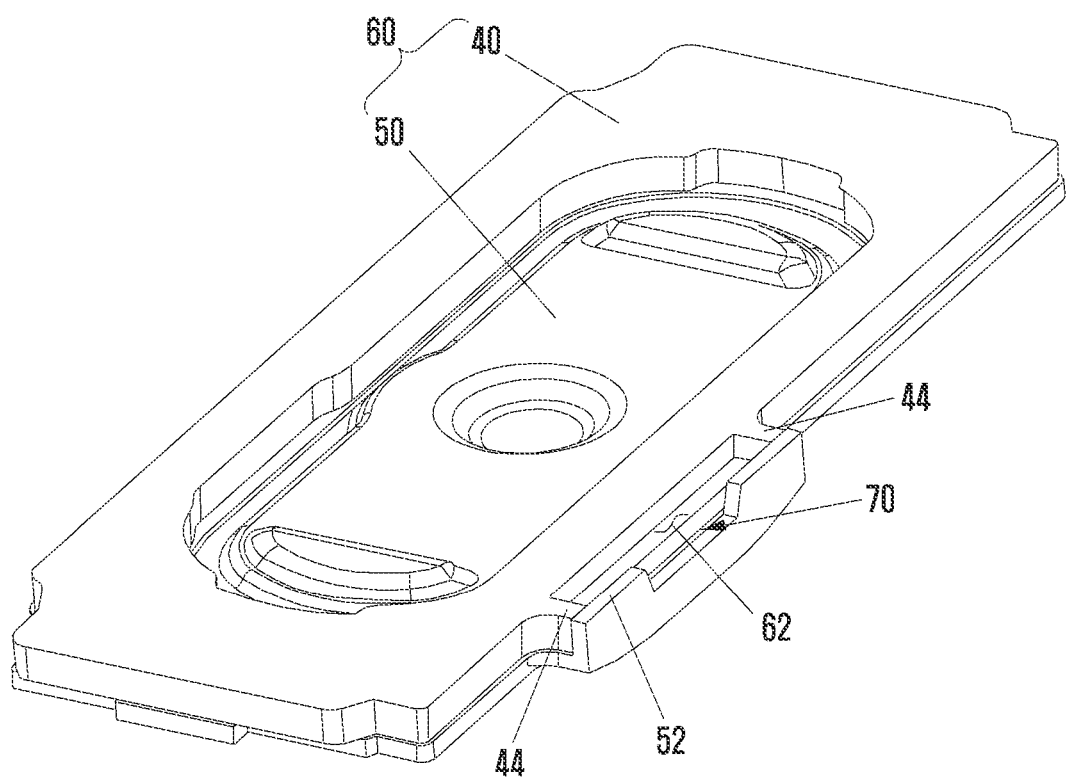
FIG. 8 is a perspective view illustrating an insert-injected product in which silicon rubber is bonded to the bracket of FIG. 7 according to various embodiments of the present disclosure.

FIG. 8 is a perspective view illustrating an insert-injected product in which silicon rubber is bonded to the bracket of FIG. 7 according to various embodiments of the present disclosure.

Referring to FIGS. 5 and 6, the waterproof structure of the home-key of the electronic device, according to various embodiments of the present disclosure, includes a flexible printed circuit board 30, a circuit board bracket 40 to which the flexible printed circuit board 30 is attached, and silicon rubber 50 to seal the bracket 40 to which the flexible printed circuit board 30 is assembled, and the bracket 40 and the silicon rubber 50 are combined through an insert injection.

The flexible printed circuit board 30 may be shaped into a long and narrow band, and may include a central vertical portion 32, and the first bent portion 34 and the second bent portion 36, which are bent in the same direction at both ends of the vertical portion 32. In addition, a key bonding portion 38 may be attached to a free end of the first bent portion 34 in the vertical direction, to which the oval home-key H is bonded.

The bonded home-key H may be provided on the back surface of the portable terminal of FIGS. 4A and 4B such that it is exposed through the lower portion of the front surface of the portable terminal body, and the home-key H may be formed of Zirconia.

According to an embodiment of the present disclosure, when the user presses the home-key H, the pressure acting on the home-key H may be applied to the silicon rubber 50. Then, the silicon rubber 50 may be pressed by the pressure to thereby apply the pressure to a dome switch (not shown), or to transfer the pressure to a piezoelectric element (not shown) to come into contact with a contact electrode to generate a predetermined electric signal, and the electric signal may be transferred to a main circuit board.

The main circuit board may detect a user's touch by using the generated electric signal, and may perform a predetermined function of the home-key H in response to the electric signal. Here, the predetermined function may include the conversion of the display image into a background image, or the conversion from a standby mode into an activation mode. In the activation mode, functions of a connection to networks, outbound calls, or inbound calls may be performed. In the present disclosure, the function of the home-key H may not be limited thereto.

According to various embodiments of the present disclosure, the first and second bent portions 34 and 36 of the flexible printed circuit board 30 may be bent in the opposite direction to each other according to the attachment position.

The bracket 40 may be shaped into a rectangle, as shown in FIG. 7, and an opening 42, which has a shape corresponding to the home-key H, may be formed in the center thereof in order to attach the home-key H to the same.

As shown in FIG. 8, the insert-injected product 60 made by insert-injecting the bracket 40 and the silicon rubber 50 may include a silicon-not-attached portion 70 for assembling the flexible printed circuit board 30.

According to an embodiment of the present disclosure, the silicon-not-attached portion 70 of the insert-injected product 60 may be formed by coating a releasing agent on a part of the edge area of the bracket 40, where the flexible printed circuit board 30 passes, before the insert injection.

Other portions of the bracket 40 except for the part of the edge area, where the flexible printed circuit board 30 passes, may be bonded with the silicon rubber 50 to then be insert-injected so that the insert-injected product 60 may be waterproofed.

The bracket 40 and the silicon rubber 50 in the silicon-not-attached portion 70, i.e., in the releasing agent coated area, are not bonded to each other to be easily detached from each other, so that the flexible printed circuit board 30 may be assembled through the same.

A pair of protrusions 44 may be provided at the upper portion of the edge of the bracket 40 in the silicon-not-attached portion 70. The pair of protrusions 44 may form an adhesive discharging portion 62 where the adhesive is discharged to bond the silicon-not-attached portion 70 between the silicon rubber 50 and the bracket 40 in order to thereby seal the same.

The silicon rubber 50 may be shaped into a rectangle corresponding to the bracket 40, and may include ribs 52 to enclose the pair of protrusions 44 forming the adhesive discharging portion 62.

According to an embodiment of the present disclosure, since the ribs 52 are formed to enclose the pair of protrusions 44, the adhesive discharged in the adhesive discharging portion 62 may be prevented from overflowing.

In the key-waterproof structure, according to various embodiments of the present disclosure, the flexible printed circuit board 30 is assembled through the silicon-not-attached portion 70 of the insert-injected product 60, and when the adhesive is discharged in the adhesive discharging portion 62, the ribs 52 prevent the discharged adhesive from overflowing, so that the silicon-not-attached portion 70 can be bonded to be sealed for waterproofing. Herein, according to various embodiments of the present disclosure, the flexible printed circuit board 30 may assembled through the silicon-not-attached portion 70 of the insert-injected product 60, and when the adhesive is discharged in the adhesive discharging portion 62, the ribs 52 prevent the discharged adhesive from overflowing, so that only the silicon-not-attached portion 70 can be bonded to be sealed for waterproofing.

Figure 9:
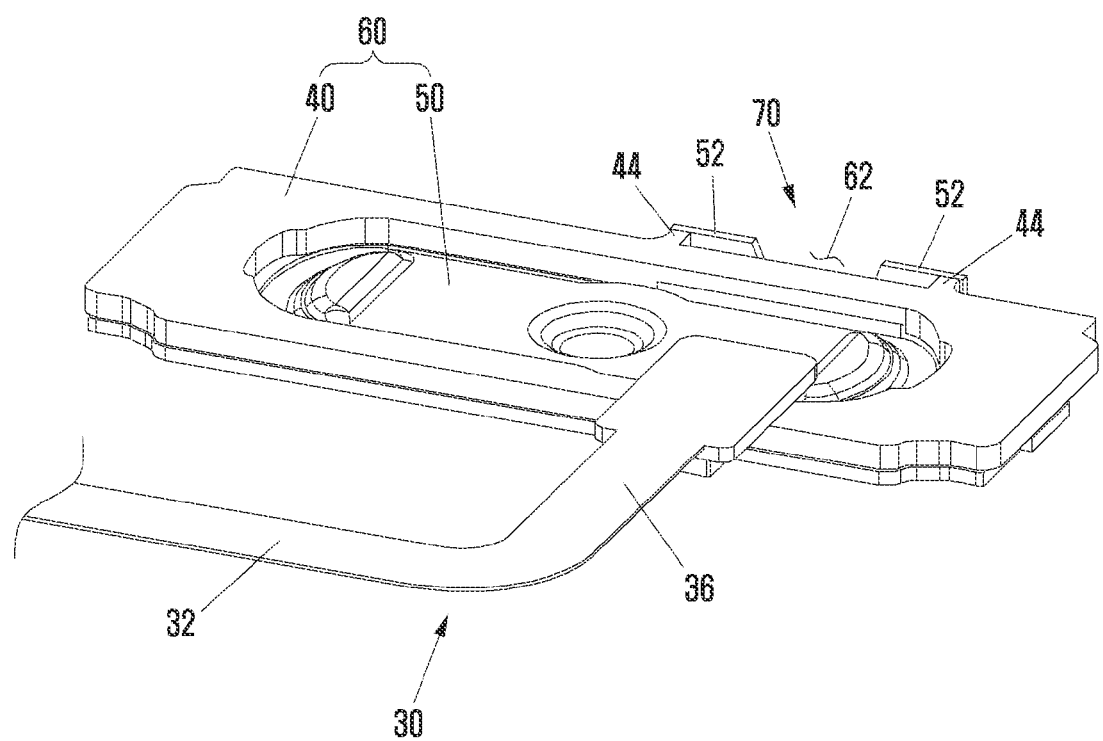
FIG. 9 is a schematic diagram to explain the assembly of a flexible printed circuit board with respect to the insert-injected product of FIG. 8 according to various embodiments of the present disclosure.

FIG. 9 is a diagram to explain the assembly of a flexible printed circuit board with respect to the insert-injected product of FIG. 8 according to an embodiment of the present disclosure.

Figure 10:
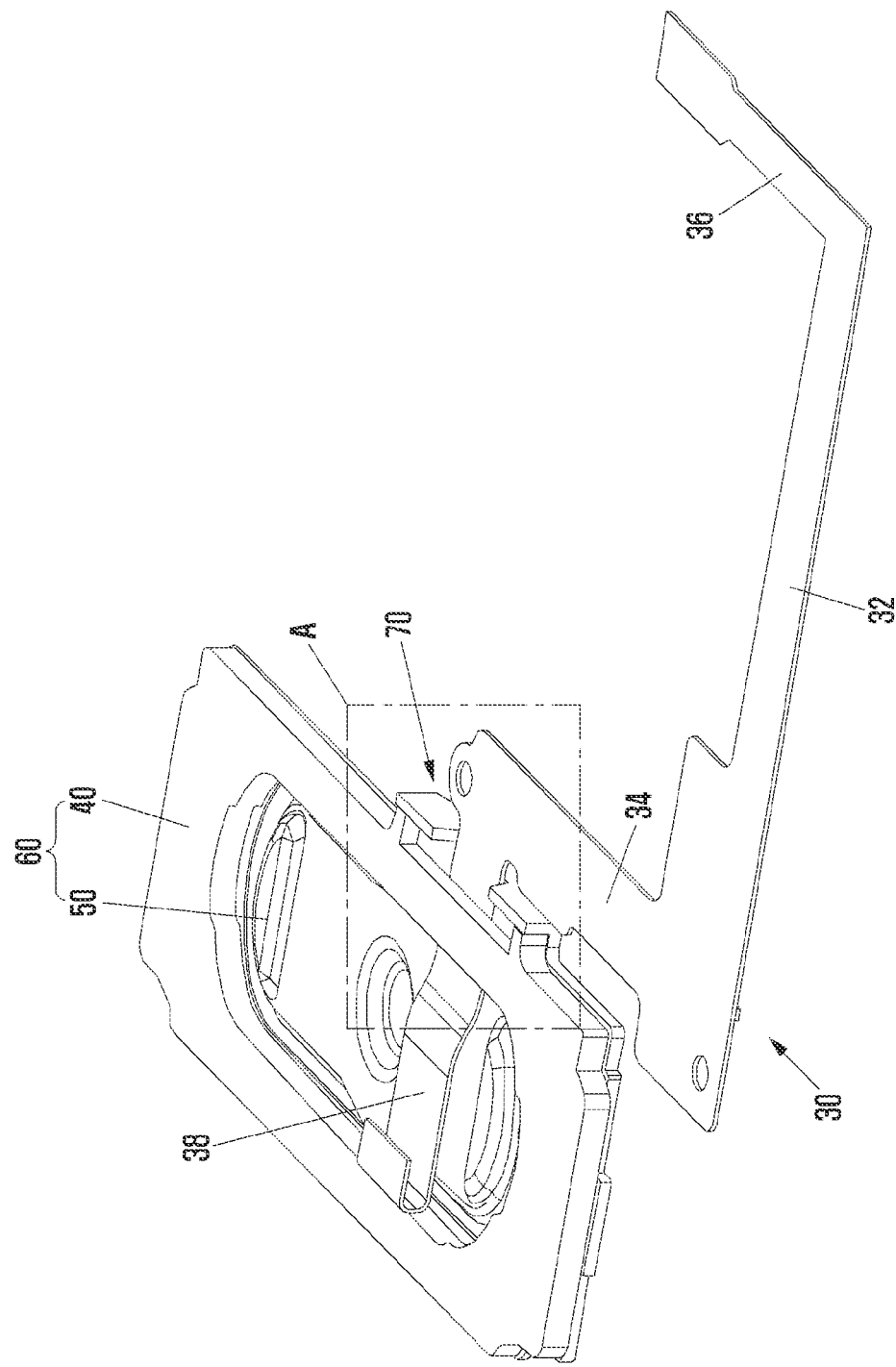
FIG. 10 illustrates the insert-injected product to which the flexible printed circuit board of FIG. 9 has been assembled according to various embodiments of the present disclosure.

FIG. 10 illustrates the insert-injected product to which the flexible printed circuit board of FIG. 9 has been assembled according to an embodiment of the present disclosure.

Figure 11:
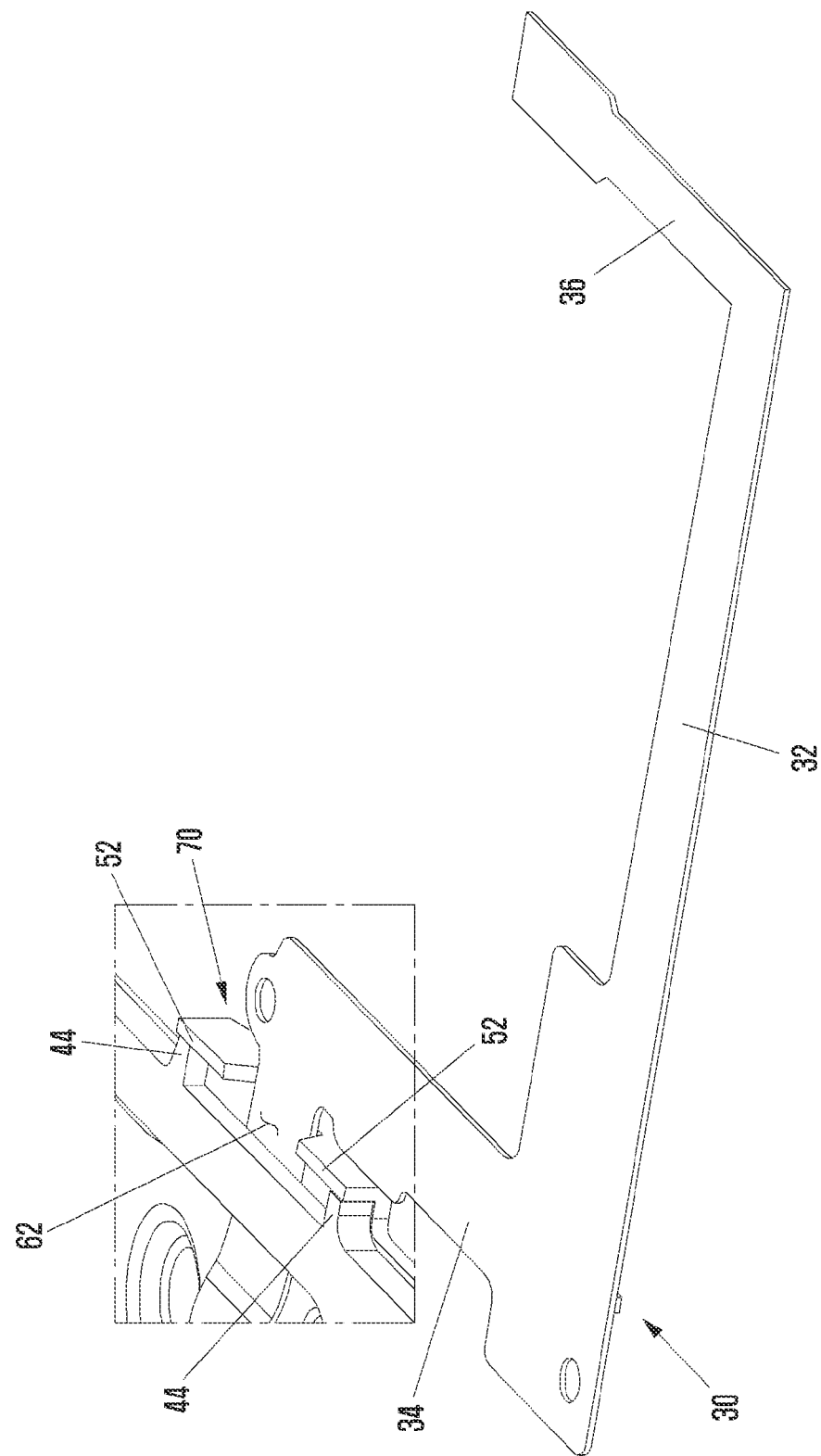
FIG. 11 is a detailed view of the area "A" of FIG. 10 according to various embodiments of the present disclosure.
Figure 12:
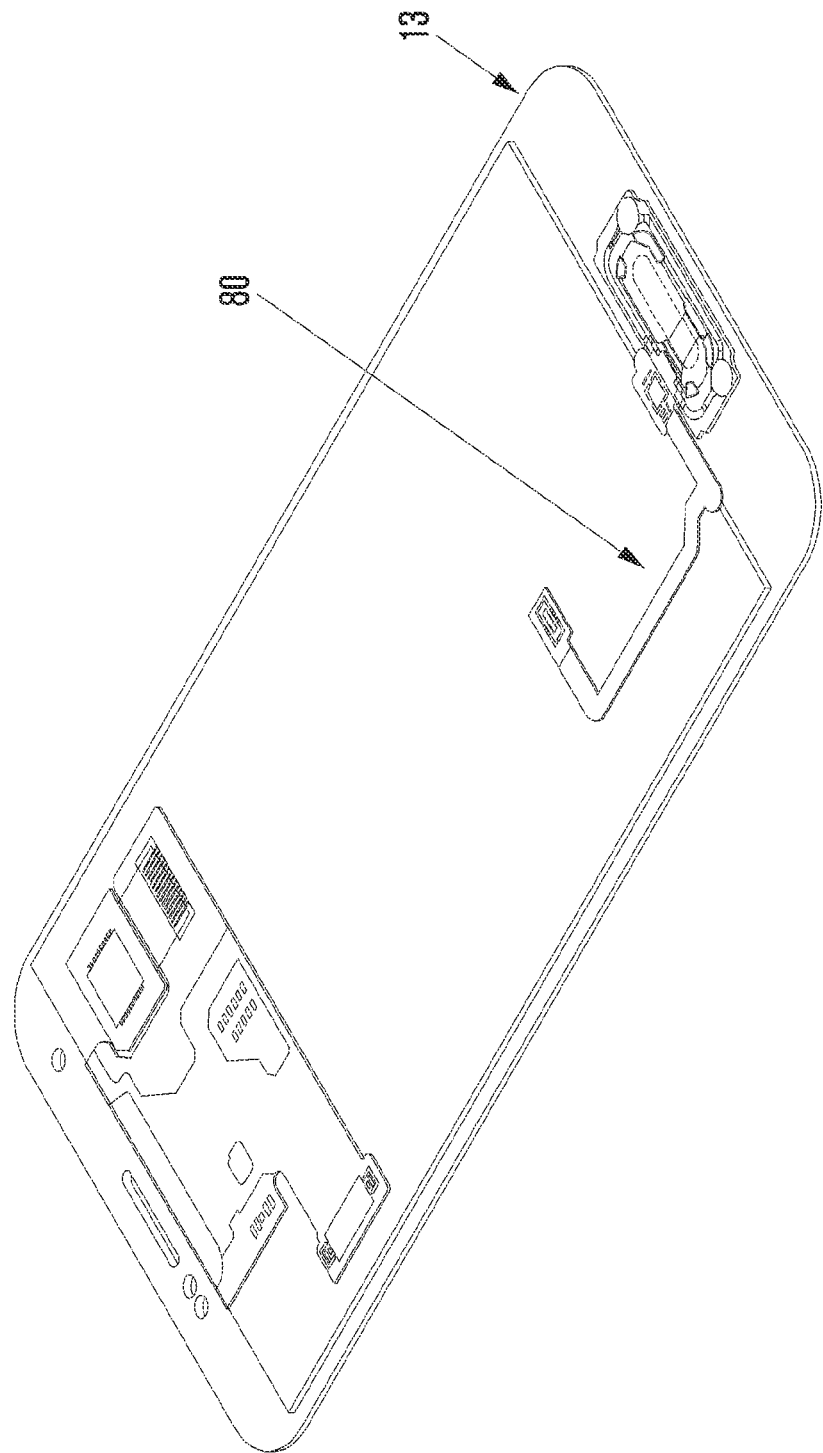
FIG. 12 is a plan view illustrating a key-waterproof structure assembled to the back surface of a display device of the portable terminal of FIG. 4A according to various embodiments of the present disclosure.

FIG. 11 is a detailed view of the area "A" of FIG. 10, and FIG. 12 illustrates a key-waterproof structure assembled to the back surface of a display device of the portable terminal of FIG. 4A according to an embodiment of the present disclosure.

Referring to FIGS. 9 to 12, in order to assemble the flexible printed circuit board 30 to the insert-injected product 60, the silicon rubber 50 is pulled down while the bracket 40 of the insert-injected product 60 faces upwards to be thereby elongated due to the elasticity of the silicon rubber 50 so that the space between the bracket 40 and the silicon rubber 50 may be widened.

According to an embodiment of the present disclosure, as shown in FIG. 9, the second bent portion 36 of the flexible printed circuit board 30 is inserted in the vertical direction through the space between the bracket 40 and the silicon rubber 50 from the opening 42 to the silicon-not-attached portion 70. At this time, the vertical portion 32 is maintained to be horizontal in the opening 42, and the first bent portion 34 and the home-key H remain in the vertical state.

In addition, the vertical portion 32 is inserted toward the silicon-not-attached portion 70, following the second bent portion 36 of the flexible printed circuit board 30, which has been inserted into the silicon-not-attached portion 70, and then, the vertical portion 32 and the first bent portion 34 are pulled while the vertical portion 32 and the edge of the first bent portion 34 are rotated counterclockwise, so that the whole of the first bent portion 34 can be inserted. Next, after the first bent portion 34 passes through the silicon-not-attached portion 70, the key bonding portion 38, to which the home-key H is to be bonded, is rotated to be vertical with respect to the silicon-not-attached portion 70, as shown in FIG. 10, so that the home-key H may be placed in the opening 42 of the bracket 40.

Finally, the silicon-not-attached portion 70 is bonded in order to waterproof the silicon-not-attached portion 70 of the insert-injected product 60 assembled with the flexible printed circuit board 30. For example, as shown FIG. 11, the adhesive is discharged into the adhesive discharging portion 62 of the insert-injected product 60, which is enclosed by the protrusions 44 and the ribs 52, to waterproof the silicon-not-attached portion 70 to thereby complete the key-waterproof structure. Herein, only the silicon-not-attached portion 70 may be bonded in order to waterproof the silicon-not-attached portion 70 of the insert-injected product 60 assembled with the flexible printed circuit board 30.

As shown in FIG. 12, the key-waterproof structure 80 set forth above may be assembled to the back surface of the display device 13 of the portable terminal in FIG. 4A in order for the home-key H to be exposed to the front.

As describe above, the key-waterproofing method of the electronic device, according to various embodiments of the present disclosure, includes the first process of assembling the flexible printed circuit board 30 through the silicon-not-attached portion 70 of the insert-injected product 60, and the second process of bonding the silicon-not-attached portion 70.

On the contrary, the related-art key-waterproof structure is made by stacking the components and bonding the same, and more specifically, the related-art method includes seven processes, such as a process of attaching the tape to the bracket and pressing the same using a tape-attachment-and-press jig, a process of pressing a neck-end portion of the assembly using a lower plate clamping jig, a waterproofing bonding process using an automatic dispenser, a silicon assembling process, a silicon pressing process using a clamping lower plate and a press jig, a visual inspection process, and a process of clamp-combining the lower plate and the upper plate. Thus, according to the related-art method, the bonding area is wide because the whole area between the circuit board and the silicon member should be bonded for waterproofing, and it is difficult to find and manage water-seepage points caused by the bonding failure. However, according to the present disclosure, the basic waterproof area can be secured through the insert injection, and the management of waterproofing may focus on the bonding of the portion through which the flexible printed circuit board passes, so waterproof structure can be easily attained because the management area for waterproofing is small.

As described above, the electronic device adopting the key-waterproof structure and a method of waterproofing a key, according to various embodiments of the present disclosure, may be made of two processes, such as a process of forming the silicon-not-attached portion for assembling the flexible printed circuit board in the insert-injected product after the circuit board bracket and the silicon rubber are sealed through the insert injection, and a process of bonding only the silicon-not-attached portion for waterproofing after assembling the flexible printed circuit board through the silicon-not-attached portion. Therefore, according to the present disclosure, the process can be simplified, and waterproofing failure can be reduced. In addition, the assembly cost can be reduced due to the reduction in use of the assembly equipment and jigs to thereby enhance the productivity.

Although the description for the key-waterproof structure of the present disclosure is made of the home-key in the specification, other keys for performing various functions rather than the home-key may be applied to the key-waterproof structure of the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a body;
   a display device disposed in the body; and
   a key-waterproof structure of a key including a bracket and an elastic rubber,
   wherein the key-waterproof structure of the key is made by insert-injecting the bracket and the elastic rubber, and is configured to include a first sealing portion and a second sealing portion,
   wherein the bracket has an opening in a center thereof, which has a shape corresponding to the key so that the key is inserted thereto,
   wherein the first sealing portion and the second sealing portion are formed around the opening,
   wherein the first sealing portion is where the bracket and the elastic rubber are bonded,
   wherein an assembling portion is formed in order to assemble a flexible printed circuit board between the bracket and the elastic rubber, and
   wherein the second sealing portion is disposed at the assembling portion.

2. The electronic device of claim 1, wherein a shape of the elastic rubber corresponds to a shape of the insert-injected bracket.

3. The electronic device of claim 1, wherein the insert-injected bracket includes a pair of protrusions in the assembling portion, which form an adhesive discharging portion where an adhesive is disposed when assembling the assembling portion.

4. The electronic device of claim 2, wherein the elastic rubber includes ribs that enclose the pair of protrusions.

5. The electronic device of claim 1, wherein the assembling portion is formed by coating a releasing agent where the flexible printed circuit board is assembled before an insert injection.

6. The electronic device of claim 1, wherein the flexible printed circuit board includes a vertical portion, and a first bent portion and a second bent portion that are bent from the vertical portion.

7. The electronic device of claim 6, wherein the key disposed in the body is bonded to an upper portion of the first bent portion.

8. The electronic device of claim 1, wherein the flexible printed circuit board is inserted toward the assembling portion in the key-waterproof structure to be assembled.

9. The electronic device of claim 1, wherein the key is a home key of the electronic device.

10. A method of waterproofing for an electronic device with a key, the method comprising:
    forming a key-waterproofing structure of a key that is made by insert-injecting a bracket and an elastic rubber and is configured to include a first sealing portion and a second sealing portion;
    assembling a flexible printed circuit board to the key-waterproof structure through an assembling portion; and
    bonding the assembling portion in order to waterproof the assembling portion of the key-waterproof structure assembled with the flexible printed circuit board,
    wherein the bracket has an opening in a center thereof, which has a shape corresponding to the key so that the key is inserted thereto,
    wherein the first sealing portion and the second sealing portion are formed around the opening,
    wherein the first sealing portion is where the bracket and the elastic rubber are bonded,
    wherein the assembling portion is formed in order to assemble the flexible printed circuit board between the bracket and the elastic rubber, and
    wherein the second sealing portion is disposed at the assembling portion.

11. The method of claim 10, wherein the flexible printed circuit board includes a vertical portion, and a first bent portion and a second bent portion that are bent from the vertical portion, wherein the key is bonded to the first bent portion, and wherein the flexible printed circuit board is assembled by inserting the second bent portion toward the assembling portion in the bracket.

12. The method of claim 11, wherein the vertical portion and the first bent portion are inserted through the assembling portion in sequence so that the key is placed on the bracket.

13. The method of claim 10, wherein the assembling portion is formed by coating a releasing agent on the flexible printed circuit board assembly area before the insert injection.

14. The method of claim 10, wherein the key is a home key of the electronic device.

* * * * *